United States Patent [19]
Rich

[11] Patent Number: 5,862,460
[45] Date of Patent: Jan. 19, 1999

[54] POWER CONTROL CIRCUIT FOR A RADIO FREQUENCY TRANSMITTER

[75] Inventor: Randall Wayne Rich, Lake Villa, Ill.

[73] Assignee: Motorola, Inc., Schaumburg, Ill.

[21] Appl. No.: 713,911

[22] Filed: Sep. 13, 1996

[51] Int. Cl.$^6$ .................................................. H04B 1/04
[52] U.S. Cl. ..................... 455/116; 455/115; 455/126; 330/279; 330/284; 370/335; 370/342
[58] Field of Search ................................... 455/115, 116, 455/126, 69, 127, 249.1, 253.2, 254; 330/284, 144, 279; 375/295, 297; 370/335, 252, 342

[56] References Cited

U.S. PATENT DOCUMENTS

| | | | |
|---|---|---|---|
| 4,553,105 | 11/1985 | Sasaki ...................................... | 330/145 |
| 5,193,223 | 3/1993 | Walczak et al. ......................... | 455/115 |
| 5,287,555 | 2/1994 | Wilson et al. ............................ | 455/115 |
| 5,307,512 | 4/1994 | Mitzlaff ................................... | 455/126 |
| 5,313,658 | 5/1994 | Nakamura ................................. | 455/69 |

*Primary Examiner*—Wellington Chin
*Assistant Examiner*—Lee Nguyen

*Attorney, Agent, or Firm*—Kevin D. Kaschke

[57] ABSTRACT

A gain controller (130) for a radio frequency (RF) transmitter (102) controls a power level of a signal (123) transmitted within a predetermined range of output power levels. The gain controller (130) provides the first gain control signal (131) and the second gain control signal (133) responsive to an output power level control signal (150). The first gain control signal (131) controls a gain of a first variable gain stage (144) to vary the power level of the transmit signal (115) at an intermediate frequency causing the output power level of the transmit signal (123) to vary over a lower range of the predetermined range of output power levels. The second gain control signal (133) controls a gain of the second variable gain stage (120) to vary the power level of the transmit signal (121) at a radio frequency causing the output power level of the transmit signal (123) to vary over an upper range of the predetermined range of output power levels. The power control circuit (130) is advantageously utilized in a code division multiple access (CDMA) radiotelephone (100) to provide power control over an 85 dB range of power levels while minimizing sideband noise emissions, current drain, and complexity of the RF transmitter (102).

30 Claims, 3 Drawing Sheets

130
GAIN CONTROLLER

POWER CONTROL CIRCUIT FOR A RADIO FREQUENCY TRANSMITTER

FIELD OF THE INVENTION

The present invention relates generally to radio frequency transmitters, and more particularly to a power control circuit for a radio frequency (RF) transmitter which may be advantageously used in a code division multiple access (CDMA) radiotelephone.

BACKGROUND OF THE INVENTION

Performance requirements for a code division multiple access (CDMA) cellular subscriber mobile station are specified in Electronic Industries Association EIA/TIA/IS-95 "Mobile Station—Land Station Compatibility Standard for Dual-Mode Wideband Spread Spectrum Cellular System", published July 1993 (herein referred to as "IS-95 Standard"). The IS-95 Standard specifies a minimum dynamic range for output power control of a transmit signal and a minimum amount of permitted transmit sideband noise emissions.

The minimum dynamic range for output power control specified for a class III mobile station is 73 dB (−50 dBm to +23 dBm). When transmit gain tolerances are considered, the required dynamic range is 85 dB.

The transmit sideband emissions specification calls out a dBc limit which is applicable at higher output power and an emission floor which is applicable at lower output power levels. For frequency offsets from the carrier frequency between 900 kHz and 1.98 MHz, the maximum emission must be less than the greater of 42 dBc/30 kHz relative to the desired transmit power in a 1.23 MHz bandwidth or both −60 dBm/30 kHz and −55 dBm/1 MHz. For frequency offsets from the carrier greater than 1.98 MHz, the maximum emission must be less than the greater of −54 dBc/30 kHz relative to the desired transmit power in a 1.23 MHz bandwidth or both −60 dBm/30 kHz and −55 dBm/1 Mhz. To produce high quality mobile stations, 10 dB of margin is added to the sideband emission specification. Therefore, the design target for the emissions floor (−60 dBm/30 kHz and −55 dBm/1 MHz) is −70 dBm/30 kHz and −65 dBm/1 MHz.

In other cellular systems (AMPS, NAMPS, NADC, GSM, PDC, etc.) the dynamic range for output power control required for mobile stations is typically much lower (i.e. 20 to 30 dB) than the dynamic range for output power control required (i.e. 85 dB) for CDMA mobile stations. In these other systems, the required dynamic range for output power control is typically provided by controlling a variable gain stage, such as a variable gain power amplifier (PA), which amplifies a radio frequency (RF) signal or by controlling a voltage controlled attenuator (VCA) which attenuates an intermediate frequency (IF) signal. Individually, these schemes do meet the dynamic range requirement for output power control or the sideband emission requirement for CDMA mobile stations.

Good transmit sideband emission performance is obtained when the gain control circuitry for the RF signal is placed close to the antenna. Unfortunately, under this condition, it is not easy to realize 85 dB of gain control of the RF signal without providing very good shielding and grounding.

A gain control range of 85 dB can be realized at a transmit signal in the IF range which is typically 100 to 200 Mhz. However, controlling an 85 dB dynamic range of power control in the IF range is disadvantageous because it does not optimize the sideband noise emissions requirement. To meet the sideband noise emissions requirement, the gain following the gain control stage must be minimized in order to minimize the sideband noise produced in the transmitter at low output power levels. This requires a higher output level out of the transmit IF gain stages. This implies high linearity for the transmit IF gain stages which results in higher current drain. For example, the SONY CXA3002N transmit gain control amplifier has 85 dB of dynamic range at intermediate frequencies only, a +10 dBm output third order intercept point (OIP3), and a current drain of 35 mA.

Another disadvantage of having the 85 dB gain control stage control the transmit signal in the IF range is the susceptibility to spurs and noise generated in other sections of the radio. For example, if the maximum output power out of the gain controlled stage is −5 dBm for adequate linearity and the worst case maximum gain following the gain controlled stage is 35 dB, the maximum noise and spurs picked up at this point must be less than both −105 dBm/30 kHz and −90 dBm/1 MHz to pass the emission floor with good margin. It is not impossible to achieve these levels, however, this would probably require the use of extra shielding and several board and/or IC revisions. Even if this degree of isolation is achieved, the current drain would still be higher than desired.

Accordingly, there is a need for a power level control circuit for a RF transmitter which provides a wide dynamic range for output power control while minimizing the sideband noise emissions, the current drain, and the complexity of the RF transmitter.

DETAILED DESCRIPTION OF A PREFERRED EMBODIMENT

Figure 1:
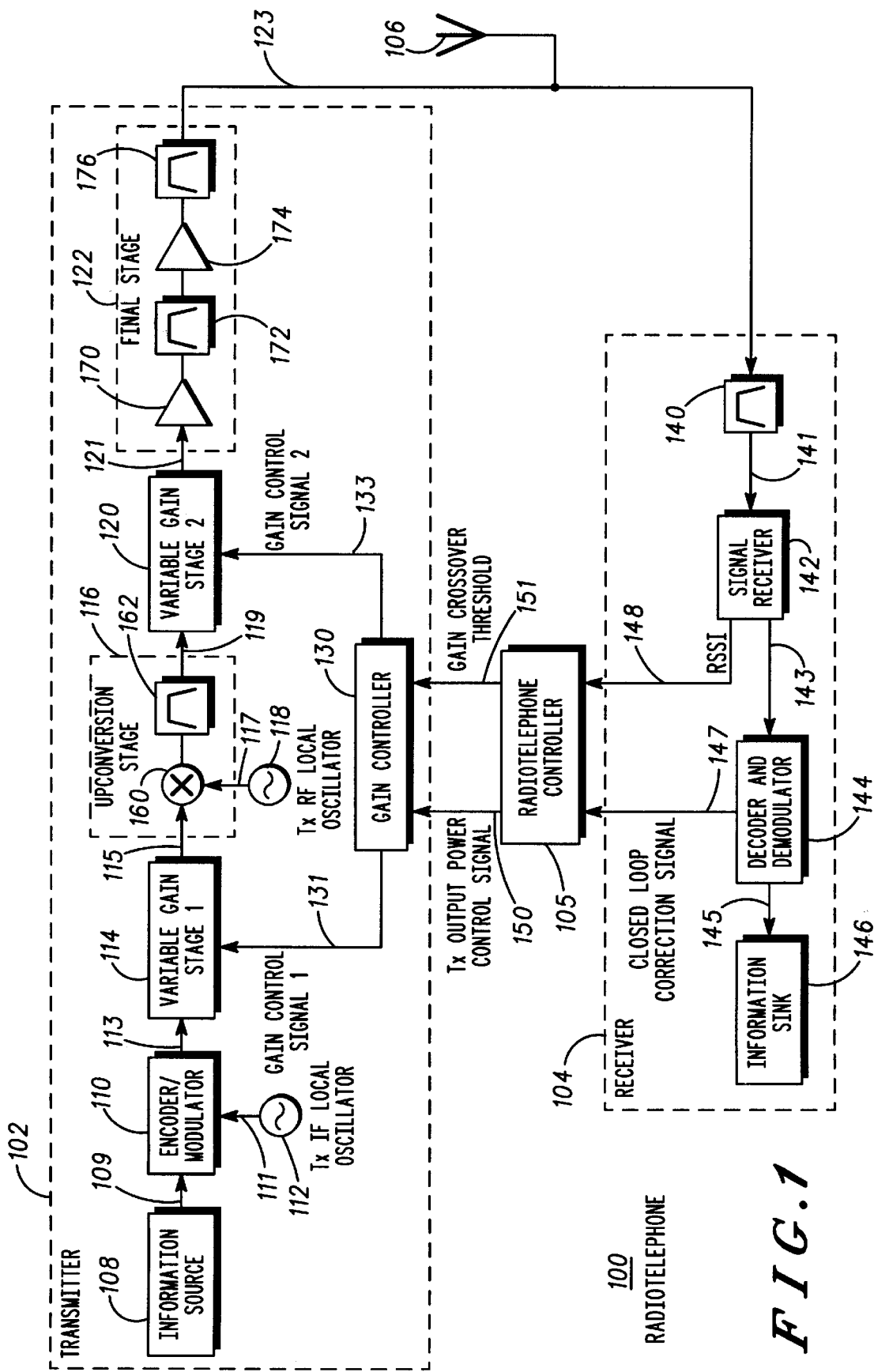
FIG. 1 illustrates a block diagram of a radiotelephone adapted for use in a code division multiple access (CDMA) radio frequency (RF) cellular telephone system.

FIG. 1 illustrates a block diagram of a radiotelephone 100 adapted for use in a code division multiple access (CDMA) radio frequency (RF) cellular telephone system. In the preferred embodiment of the present invention, radiotelephone 100 is a cellular radiotelephone. The radiotelephone 100 may take many forms that are well known in the art, such as a vehicular mounted unit, a portable unit, or a transportable unit. According to the preferred embodiment of the present invention, the cellular radiotelephone is a code division multiple access (CDMA) cellular radiotelephone designed to be compatible with a CDMA cellular radiotelephone system as described in the aforementioned IS-95 Standard.

The radiotelephone 100 generally includes a transmitter 102, a receiver 104, a radiotelephone controller 105, and an antenna 106. The receiver 104 generally includes a receive (Rx) bandpass filter 140, a signal receiver 142, a decoder and demodulator 144 and an information sink 146. The radiotelephone controller 105 generally includes a microprocessor, read only memory, and random access memory. Generally, the receiver 104, the radiotelephone controller 105, and the antenna 106 are individually well known in the art, as taught in a radiotelephone having model #SUF1712, U.S. Pat. No. 5,321,847 and the aforementioned IS-95 Standard, each herein incorporated by reference.

The transmitter 102 generally includes an information source 108, an encoder and modulator 110, a transmit (Tx) intermediate frequency (IF) local oscillator 112, a first variable gain stage 114, an upconversion stage 116, a transmit (Tx) radio frequency (RF) local oscillator 118, a second variable gain stage 120, a final stage 122 and a gain controller 130. The upconversion stage 116 generally includes an upconversion mixer 160 and a first RF bandpass filter 162. The final stage 122 generally includes an exciter amplifier 170, a second RF bandpass filter 172, a power amplifier 174, and a third RF bandpass filter 176. The transmit lineup for the upconversion stage 116 and the final stage 122 is described by example only. Other transmit lineups compatible with the present invention may be implemented, as well known to those skilled in the art of transmitter design.

The encoder portion of 110 of the transmitter 102 and the decoder and demodulator 144 of the receiver 104 are generally embodied within an application specific integrated circuit (ASIC) as described in "CDMA Mobile Station Modem ASIC", Proceedings of the IEEE 1992 Custom Integrated Circuits Conference, section 10.2, pages 1–5, and as taught in a paper entitled "The CDMA Digital Cellular System an ASIC Overview", Proceedings of the IEEE 1992 Custom Integrated Circuits Conference, section 10.1, pages 1–7 (herein incorporated by reference).

In operation, the radio transmitter 102 receives information from the information source 108, typically as voice or data. The information source provides an information signal 109 to be encoded and modulated by the encoder and modulator 110. The Tx IF local oscillator 112 generates a Tx IF local oscillator signal 111 having a frequency of 150 MHz, for example. The encoder and modulator 110 modulates the Tx IF local oscillator signal 111 responsive to the information signal 109 to produce a modulated signal 113. The center frequency of the modulated signal 113 is referred to as the Tx IF frequency and is, for example, 150 MHz. The modulated signal 113 is amplified by a variable gain stage 114, having a gain controlled by a gain control signal 131 to produce a Tx IF signal 115. The Tx RF local oscillator 118 generates a Tx RF local oscillator signal 117 having a frequency 150 MHz higher than the desired Tx RF center frequency (for example, 824 to 894 MHz). The upconversion stage 116 frequency translates the Tx IF signal 115 from the Tx IF center frequency to the desired Tx RF center frequency and filters this signal using the first RF bandpass filter 162 to produce a first Tx RF signal 119. The first Tx RF signal 119 is amplified by a second variable gain stage 120, having a gain controlled by a gain control signal 133 to produce a second Tx RF signal 121. The second Tx RF signal 121 is amplified and filtered by the final stage 122 to produce the Tx output signal 123 to be transmitted via antenna 106.

In the preferred embodiment, the first variable gain stage 114 and the second variable gain stage 120 are temperature compensated continuously variable voltage controlled attenuators. The gain transfer function for each gain stage, G(V), is largely a linear function of a control voltage over the range of operation where G(V) is the gain in dB, and V is the control voltage. Alternately, the variable gain stages could be implemented as digitally controlled attenuators or variable gain amplifiers as is well known to one skilled in the art.

The receiver 104 provides a receive signal strength indication (RSSI) signal 148 and a closed loop correction signal 147 to the radiotelephone controller 105 in a conventional manner. In a conventional manner as described in the IS-95 Standard, the radiotelephone controller 105 combines these two signals with a channel gain adjust signal indicative of the variation in transmitter and receiver gain versus frequency channel to produce a Tx output power control signal 150 indicative of the desired transmitter output power. A table of channel gain adjust signals versus frequency channel is determined during the manufacture of the radiotelephone 100 and is stored in the radiotelephone controller 105. The radiotelephone controller 105 provides the Tx output power control signal 150 and a crossover threshold signal 151 to the gain controller 130. The crossover threshold signal 151 is an important feature of the present invention and will be described in further detail with reference to FIGS. 2, 3, 4 and 5. The gain controller provides the first gain control signal 131 and the second gain control signal 133 to the first variable gain stage 114 and the second variable gain stage 120, respectively, responsive to the Tx output power signal 150 and the crossover threshold signal 151 to control the transmitter's output power while minimizing the sideband noise of the transmit output signal. The operation of the gain controller 130 is described in more detail hereinbelow with reference to FIG. 2.

The transmit output signal sideband noise can be expressed as a sum of the noise from independent noise sources amplified by the gain stages following the noise source. The sources of noise include the thermal noise of a gain stage referred to its input and external interference coupled to the input of a stage. The thermal noise of a gain stage referred to its input is defined as $kT^*B^*(F-1)$ in terms of the noise figure (F), Boltzman's constant (k, where $k=1.38*10-23$ joule/K ), temperature in Kelvin (T) and the measurement bandwidth (B) in Hz, as is well known to one skilled in the art. The thermal noise referred to the input is hereinafter denoted as Nth. For example, at T=298K (25° C.), the thermal noise referred to the input of a stage with a noise figure of 10 measured in a 30 kHz bandwidth is 1.07 femtoWatts (fW) or—119.7 dBm. The external interference at the input to the stage may be produced by common mode coupling on the supplies and grounds of the stage and/or the pick up of radiated interference from the noise sources. The interference generally consists of clock harmonics and harmonics of high speed data signals generated by other circuits in the radiotelephone. In extreme cases the interference may also be caused by high power radio sources external to the radiotelephone such as television transmitters, for example. The total noise output of a gain stage having gain (G) is $[Nth+I]^*G+No^*G$, where I is the interference picked up at the input and No is the output noise from the preceding stage. In transmitter 102, the total output noise (N) can be expressed by equation 1 (Eq. 1) shown hereinbelow.

$$N = (Nin1 + Nmod)^*G1^*Gu^*G2^*Gf + Ninu^*Gu^*G2^*Gf + Nin2^*G2^*Gf + Ninf^*Gf \qquad \text{Eq.1:}$$

where Gk is the gain of stage k, Nink=Nthk+Ik, Nthk is the thermal noise of stage k, Ik is the input interference at stage k, Nin is defined as the quantity (Nth+I), and Nmod is the output noise of the encoder/modulator 110. The definition of the subscripts, k, are defined as follows:

1-first variable gain stage 114 u-upconversion stage 116

2-second variable gain stage 120 f-final stage 122

Note that in equation 1, a reduction in the gain of the second variable gain stage 120 will reduce the contributions to total output noise from all sources except the final stage. Therefore, to minimize total output noise it is desirable to minimize the gain of the final stage 122 and maximize the range of the second variable gain stage 120. In the ideal approach, the entire output power dynamic range would be realized by controlling the second variable gain stage 120 only and the first variable gain stage would be eliminated. Practical considerations, however, preclude this for portable units, such as a CDMA radiotelephone, which are small and lightweight have low cost and low power dissipation and have high frequency and high dynamic range power control.

In transmitter 102, the output power level (P) of the desired Tx output signal 123 can be expressed by the following equation 2:

$$P = Pmod * G1 * Gu * G2 * Gf \qquad 2:$$

where Gk is the gain of stage k, and Pmod is the power level of the modulated signal 113. The definition of the subscripts, k, are the same as that described above in equation 1.

A challenge in implementing the ideal approach is achieving the 85 dB output power control dynamic range at the RF frequency (for example, 824–849 Mhz). The challenge becomes even greater at higher frequencies. At minimum output power, the input signal to the second variable gain stage 120 is up to 85 dB greater than the output power. Some of the same issues discussed above regarding interference apply to the coupling of the second variable gain stage 120 input signal to the output of the stage. The coupling may be produced by common mode coupling on the supplies and grounds of the stage and/or the pick up at the output of a radiated input signal. Theoretically, this problem may be overcome using multiple stages at the radio frequency, good grounding practices, and shielding; however, this is typically impractical for a small, lightweight, low cost portable unit.

According to the preferred embodiment of the present invention, a more practical solution is to divide the power control dynamic range requirements between a variable gain stage at the Tx RF frequency (824–849 MHz), such as the second variable gain stage 120, and a variable gain stage at the Tx IF frequency (150 MHz ), such as the first variable gain stage 114. A power control scheme controls the second variable gain stage 120 over as much of the power control dynamic range as possible and controls the first variable gain stage 114 over the remaining range. Therefore, the gain control range of the second variable gain stage 120 is maximized, limited only by practical considerations to 45 dB, for example. The gain control range of the first variable gain stage 114 is then designed to be at least 40 dB (i.e. 85 dB–45 dB). Equation 1, described hereinabove, shows that the output noise is highest at the highest gain settings. Therefore, it is desirable to adjust the second variable gain stage 120 over the high power end of the output power dynamic range, and adjust the first variable gain stage 114 over the lower power end of the output power dynamic range.

Figure 3:
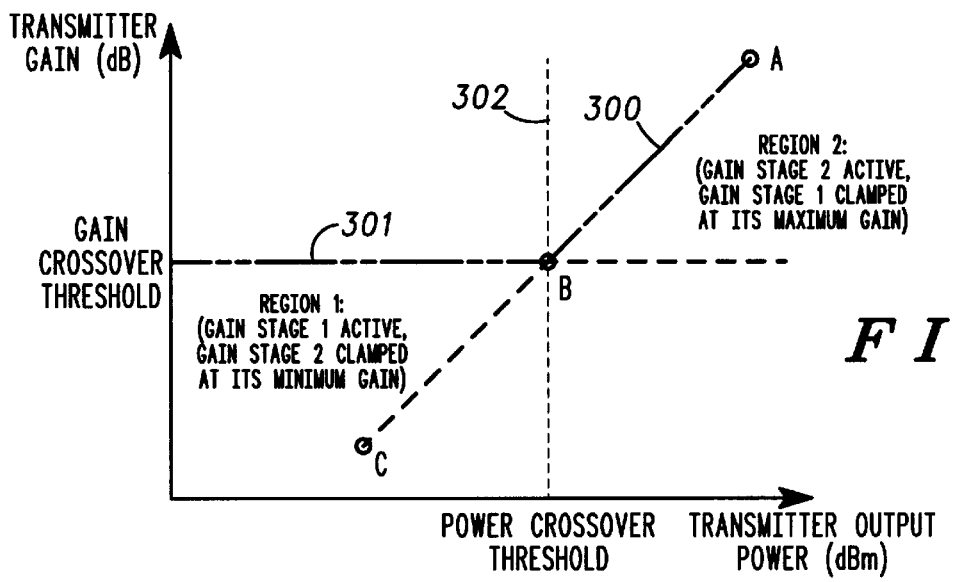
FIG. 3 illustrates a graph, combining the graphs shown in FIGS. 3 and 4, showing total gain versus output power for a transmitter shown in the radiotelephone of FIG. 1.
Figure 4:
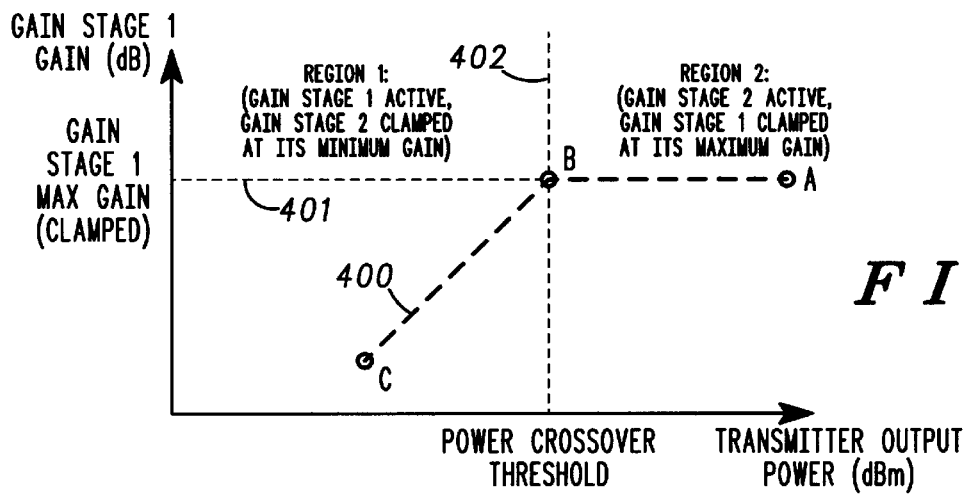
FIG. 4 illustrates a graph showing gain versus output power for a first variable gain stage of a transmitter shown in the radiotelephone of FIG. 1.
Figure 5:
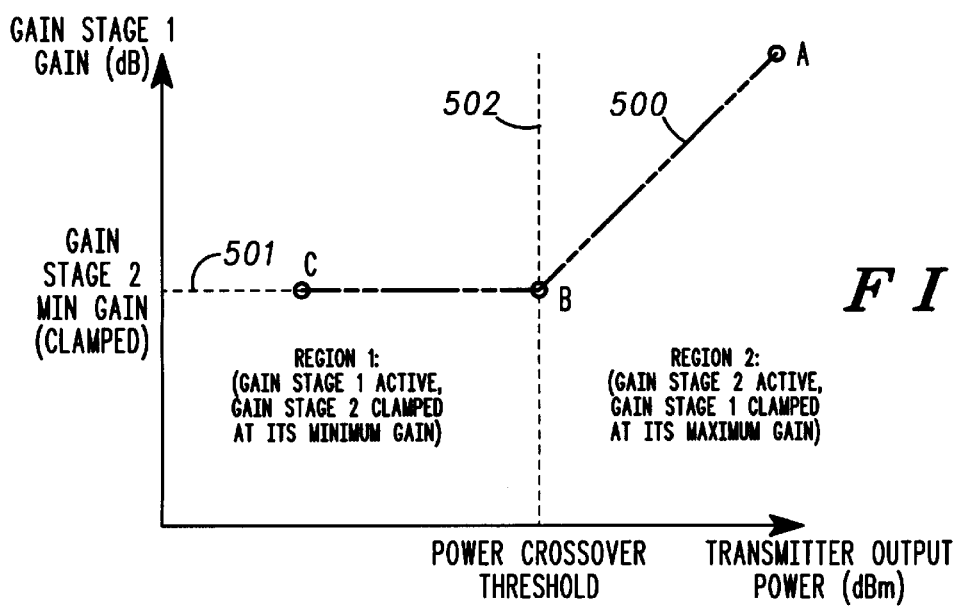
FIG. 5 illustrates a graph showing gain versus output power for a second variable gain stage of a transmitter shown in the radiotelephone of FIG. 1.

According to the preferred embodiment, a practical power control scheme operation is further illustrated in FIGS. 3, 4 and 5. FIG. 3 illustrates a graph, combining the graphs shown in FIGS. 4 and 5, showing total gain versus total output power for a transmitter shown in the radiotelephone of FIG. 1. The graph in FIG. 3 shows the division of the transmitter gain control function between the first variable gain stage 114 and the second variable gain stage 120. Curve 300 is a plot of transmitter gain in dB versus transmitter output power in dBm. Dashed line 301 denotes the Gain crossover level. Dashed line 302 denotes the power crossover level. At point A on curve 300, both first variable gain stage 114 and second variable gain stage 120 are at their predetermined maximum gain settings. At point B on curve 300, the first variable gain stage 114 is set to its predetermined maximum gain setting and the second variable gain stage 120 is set to its predetermined minimum gain setting. Point B on curve 300 denotes a transition or crossover in the gain control between the second variable gain stage 120 and the first variable gain stage 114. At point C on curve 300, both first variable gain stage 114 and second variable gain stage 120 are at their predetermined minimum gain settings. Region 1 on the graph below dashed line 301 and to the left of dashed line 302 corresponds to the low end of transmitter output power/gain. In this region the second variable gain stage 120 gain is held constant at its minimum value and the first variable gain stage 114 gain is varied to vary the transmitter output power. In Region 1 a 1 dB reduction in desired output power results in a 1 dB reduction in first variable gain stage 114 gain and results in a 1 dB reduction in the noise contributions from the first term in equation 1, described hereinabove. Region 2 on the graph above dashed line 301 and to the right of dashed line 302 corresponds to the high end of transmitter output power/gain. In this region second variable gain stage 120 is varied to vary the transmitter output power, and the first variable gain stage 114 gain is held constant at its maximum setting. In Region 2 a 1 dB reduction in desired output power results in a 1 dB reduction in second variable gain stage 120 gain and results in reduction of all output noise contributions except for the last term (final stage) in equation 1, described hereinabove.

FIG. 4 illustrates a graph showing gain versus output power for the first variable gain stage 114. Curve 400 is a plot of first variable gain stage 114 gain in dB vs. transmitter output power in dBm. Dashed line 401 denotes the maximum gain level of the first variable gain stage. Dashed line 402 denotes the power crossover threshold level. At point A on curve 400, the first variable gain stage 114 is clamped to its predetermined maximum gain setting. At point B on curve 400, the first variable gain stage 114 is clamped to its predetermined maximum gain setting. Point B on curve 400 denotes a transition or crossover in the gain control between the second variable gain stage 120 and the first variable gain stage 114. At point C on curve 400, the first variable gain stage 114 is at its minimum gain setting. Region 1 on the graph to the left of dashed line 402 corresponds to the low end of transmitter output power/gain. In this region the second variable gain stage 120 gain is held constant at its minimum value and the first variable gain stage 114 gain is varied to vary the transmitter output power. Region 2 on the graph to the right of dashed line 402 corresponds to the high end of transmitter output power/gain. In this region the first variable gain stage 114 gain is held constant or clamped at its maximum setting.

FIG. 5 illustrates a graph showing gain versus output power for the second variable gain stage 120. Curve 500 is a plot of second variable gain stage 120 gain in dB vs. transmitter output power in dBm. Dashed line 501 denotes the predetermined minimum gain level of the second variable gain stage. Dashed line 502 denotes the power crossover threshold level. At point A on curve 500, the second variable gain stage 120 is set to its maximum gain setting. At point B on curve 500, the second variable gain stage 120 is clamped to its predetermined minimum gain setting. Point B on curve 500 denotes a transition or crossover in the gain control between the second variable gain stage 120 and the first variable gain stage 114. At point C on curve 500, the second variable gain stage 120 is at its minimum gain setting. Region 1 on the graph to the left of dashed line 502 corresponds to the low end of transmitter output power/gain. In this region the second variable gain stage 120 gain is held constant or clamped at its minimum value Region 2 on the graph to the right of dashed line 502 corresponds to the high end of transmitter output power/gain. In this region second variable gain stage 120 is varied to vary the transmitter output power.

Figure 2:
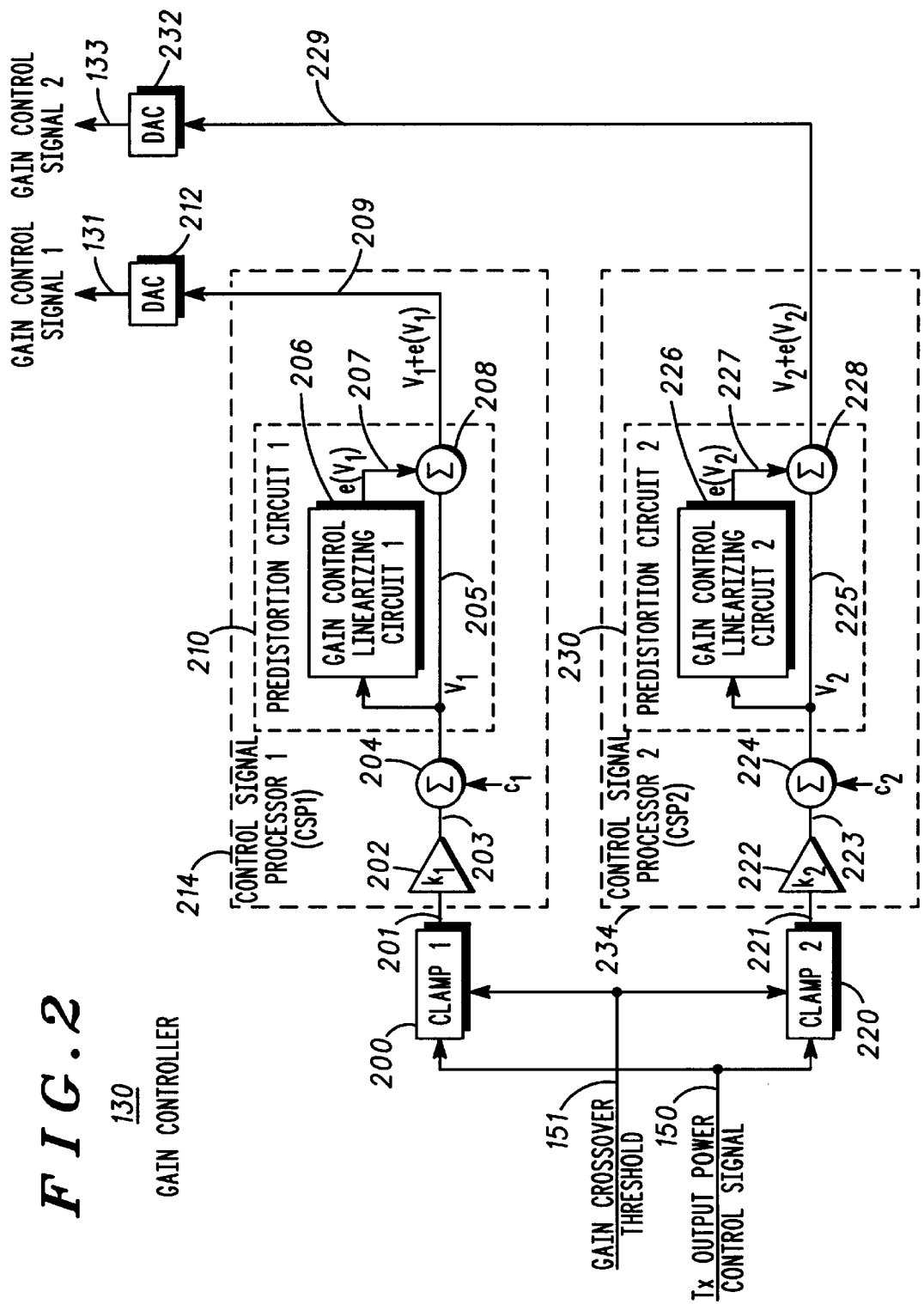
FIG. 2 illustrates a block diagram of a gain controller shown in the radiotelephone of FIG. 1.

Referring now to FIG. 2, FIG. 2. illustrates a block diagram of the gain controller 130 as shown in FIG. 1. The gain controller 130 is coupled to first variable gain stage 114 and the second variable gain stage 120 via gain control signal 131 and second gain control signal 133, respectively. The gain controller 130 is coupled to receive the transmit output power level control signal 150 and the gain crossover threshold signal 151.

The gain controller 130 generally includes a first clamp 200, a first control signal processor 214, a first digital to analog converter (DAC) 212, a second clamp 220, a second control signal processor 234, and a second digital to analog converter (DAC) 232. The first control signal processor 214 generally includes a first multiplier or scaler 202, a first summer or shift circuit 204, and a first predistortion circuit 210. The first predistortion circuit 210 generally includes a first gain control linearizing circuit 206 and a third summer 208. The second control signal processor 234 generally includes a second multiplier or scaler 222, a second summer or shift circuit 224, and a second predistortion circuit 230. The second predistortion circuit 230 generally includes a second gain control linearizing circuit 226 and a third summer 228.

In gain controller 130, the DAC 212 and the DAC 232 are preferably implemented in hardware. Further, in gain controller 130, the clamp 200, the clamp 220, the first control signal processor 214, and the second control signal processor 234 are preferably implemented in software. However, any allocation of hardware and software among the elements of the gain controller 130 can be used, as is well known to one skilled in the art.

The desired output power level is provided to the gain controller 130 via an output power control signal 150 from the radiotelephone controller 105. A crossover threshold signal 151 is also provided to the gain controller 130 from the radiotelephone controller 105. The crossover threshold signal 151 is indicative of the output power level or transmitter gain level at which the control of the transmitter output power/gain crosses over between the first variable gain stage 114 and the second variable gain stage 120. The crossover threshold signal 151 is a function of frequency channel and is stored in the radiotelephone controller 105 as a table during the manufacture of the radiotelephone 100. The output power control signal 150 and the crossover threshold signal 151 are applied to the inputs of the first clamp 200 and the second clamp 220 circuits.

Generally, the first clamp 200 and the second clamp 220 comprise a crossover circuit which provides continuous output power level control of the transmit signal between the lower range and the upper range of the predetermined range of the output power levels by controlling the first gain control signal 131 and the second gain control signal 133 responsive to the output power level control signal 150 and a crossover threshold signal 151.

More particularly, the first clamp 200 generates a first clamp output signal 201 responsive to the output power control signal 150 and crossover threshold signal 151. The second clamp 220 generates a second clamp output signal 221 responsive to the output power control signal 150 and crossover threshold signal 151. When the output power control signal 150 is greater than the crossover threshold signal 151, the first clamp output signal 203 is equal to the crossover threshold signal 151 and the second clamp output signal 223 is equal to the output power control signal 150. When the output power control signal 150 is less than the crossover threshold signal 151, the first clamp output signal 203 is equal to the output power control signal 150 and the second clamp output signal 223 is equal to the crossover threshold signal 151.

The first clamp output signal 203 is processed by the first control signal processor 214 to produce a first control signal processor output signal 209. The first control signal processor output signal 209 is converted from a digital signal to an analog signal by DAC 212 to produce gain control signal 131. In the preferred embodiment, the scaler 202 and the shifter 204 form a first linear transformer, coupled to receive the first clamp output signal 201 from the first clamp, for converting the first clamp output signal 201 to a first linear transformer output signal 205 representative of the first gain control signal 131. The function of first control signal processor 214 is to transform the gain transfer function of the first variable gain stage 114 to a preferred gain transfer function. The gain transfer function of the first variable gain stage 114 is defined as the gain of the first variable gain stage 114 as a function of first control signal 131. The preferred gain transfer function for the first variable gain stage 114 is defined as the gain of the first variable gain stage 114 as a function of output power control signal 150. Preferably, the preferred gain transfer function is of the form, $G(P)=P+a1$, where $G(P)$ is the gain of first variable gain stage 114 in dB, P is the output power control signal 150 value in dBm, and a1 is a constant. The constant a1 is also referred to as an offset. The slope of the desired transfer function is one so that an output power control signal 150 change of 1 dB results in a first variable gain stage 114 gain change of 1 dB. The slope of the preferred gain transfer function is also referred to as a sensitivity representing a change in gain to a change in the output power control signal.

Likewise, The second clamp output signal 223 is processed by the second control signal processor 234 to produce a second control signal processor output signal 229. The second control signal processor output signal 229 is converted from a digital signal to an analog signal by DAC 232 to produce second gain control signal 133. In the preferred embodiment, the scaler 222 and the shifter 224 form a second linear transformer, coupled to receive the second clamp output signal 221 from the second clamp 220, for converting the second clamp output signal 221 to a second linear transformer output signal 225 representative of the second gain control signal 133. The function of second control signal processor 234 is to transform the gain transfer function of the second variable gain stage 120 to a preferred gain transfer function. The gain transfer function of the second variable gain stage 114 is defined as the gain of the second variable gain stage 114 as a function of second control signal 131. The preferred gain transfer function for the second variable gain stage 114 is defined as the gain of the second variable gain stage 114 as a function of output power control signal 150.

Preferably, the preferred gain transfer function is of the form, $G(P)=P+a2$, where $G(P)$ is the gain of second variable gain stage 120 in dB, P is the output power control signal 150 value in dBm, and a2 is a constant. The constant a2 is also referred to as an offset. The slope or sensitivity of the preferred gain transfer function is one so that a output power control signal 150 change of 1 dB results in a second variable gain stage 120 gain change of 1 dB.

The first control signal processor 214 and second control signal processor 234 circuits are preferably used because the gain transfer functions of the first variable gain stage 114 and second variable gain stage 120 are not perfectly represented by the preferred gain transfer function and/or are not perfectly represented by a linear equation over the entire range of operation. In the preferred embodiment, the first variable gain stage 114 and the second variable gain stage 120 have gain transfer functions that are largely linear over their respective gain control ranges and are monotonically increasing with the control signal. In general these gain transfer functions are of the form G(V)=mV+b+d(V) where V is the gain control signal voltage, G(V) is the gain in dB, m and b are constants, and d(V) represents any deviation from the linear portion of the equation mV+b. The constant m represents a slope or sensitivity and b represents an offset. The first control signal processor 214 and second control signal processor 234 circuits are adjusted during manufacture so that the cascade of the control signal processor stage with the corresponding variable gain stage transfer function G(V) produces the preferred gain transfer functions G(P). In other words, G(V(P))=P+a1 for first control signal processor 214 or G(V(P))=P+a2 for second control signal processor 234. The operation of the first control signal processor 214 is further described hereinbelow. The operation of the second control signal processor 234 is identical to the operation of the first control signal processor 214, with the appropriate changes in nomenclature, and is omitted for the sake of brevity.

In first control signal processor 214 the first clamp output signal 203 is multiplied by first multiplier 202 having gain k1 to produce a first multiplier output signal 203. The first multiplier output signal 203 is summed with constant, c1, in first summer 204 to produce a first summer output signal 205. The first summer output signal 205 is provided to a first predistortion circuit 210 to produce the first control signal processor output signal 209. The transfer function of the first control signal processor 214 is first described for the case in which the first variable gain stage 114 has a linear gain transfer function G(V)=ml*V+b1, i.e. d(V)=0. Again, the preferred gain transfer function G(V(P)) is of the form G(V(P))=P+a1. The desired first control signal processor 214 transfer function is then of the form V(P)=k1*P+c1 where k1=1/m1, and c1=(a1−b1)/m1. k1 and c1 are determined during the manufacture of the radiotelephone. In this equation V(P)=k1*P+c1, k1 represents a slope or sensitivity and c1 represents an offset.

The gain transfer function of first variable gain stage 114 is monotonically increasing with the control signal voltage. Therefore, first predistortion circuit 210 can be implemented as described hereinbelow. The first summer output signal 205 (V1) is provided to the first gain control linearizing circuit 206 and the third summer 208. The first gain control linearizing circuit 206 produces one of a plurality of correction values e(V1) responsive to the first summer output signal 205. The correction value is summed with the first summer output signal 205 by the third summer 208 to produce the first control signal processor output signal 209. The correction values, e(V1) are preferably predetermined based on the known characteristics of the first variable gain stage 114 gain transfer function and stored in a table in the first gain control linearizing circuit 206. The correction values e(V1) have the property that m1*e(V1)=−d(V1+e(V1)). The table of correction values e(V1) is indexed by V1. In an alternate embodiment, the first gain control linearizing circuit 206 function, e(V1) is implemented as a piecewise linear correction equation. Alternately, the correction values or the piecewise linear correction equation are determined and stored during the manufacture of the radiotelephone.

The operation of the first control signal processor 214 is now described for the case in which the first variable gain stage 114 has a nonlinear gain transfer function G(V)= m1*V+b1+d(V). First, consider the cascaded transfer function of the first predistortion circuit 210 and the first variable gain stage 114 gain transfer function which is G(V1)=m1* (V1+e(V1))+b1+d(V1+e(V1)). Since e(V1) is such that m1*e(V1)=−d(V1+e(V1)), G(V1)=m1*V1+b1. The nonlinear case has now degenerated to the linear case described above, G(V)=m1*V+b1, where V is replaced by V1. Therefore, the desired transfer function from the first multiplier 202 input to the first summer 204 output is the same, and the constants k1 and c1 are the same (k1=1/m1, and c1=(a1−b1)/m1).

In summary, a gain controller (130) for a radio frequency (RF) transmitter (102) controls a power level of a signal (123) transmitted within a predetermined range of output power levels. The gain controller (130) provides the first gain control signal (131) and the second gain control signal (133) responsive to an output power level control signal (150). The first gain control signal (131) controls a gain of a first variable gain stage (144) to vary the power level of the transmit signal (115) at an intermediate frequency causing the output power level of the transmit signal (123) to vary over a lower range of the predetermined range of output power levels. The second gain control signal (133) controls a gain of the second variable gain stage (120) to vary the power level of the transmit signal (121) at a radio frequency causing the output power level of the transmit signal (123) to vary over an upper range of the predetermined range of output power levels. The power control circuit (130) is advantageously utilized in a code division multiple access (CDMA) radiotelephone (100) to provide power control over an 85 dB range of power levels while minimizing sideband noise emissions, current drain, and complexity of the RF transmitter (102).

What is claimed is:

1. A transmitter for transmitting a transmit signal at a power level within a predetermined range of output power levels, the transmitter comprising:

a signal generator for generating the transmit signal at an intermediate frequency;

a first variable gain stage, coupled to the signal generator, for controlling a power level of the transmit signal at the intermediate frequency responsive to a first gain control signal;

a signal upconvertor, coupled to the first variable gain stage, for converting the frequency of the transmit signal from the intermediate frequency to a radio frequency;

a second variable gain stage, coupled to the signal upconvertor, for controlling the power level of the transmit signal at the radio frequency responsive to a second gain control signal; and a gain controller, coupled to the first variable gain stage and the second variable gain stage, for providing the first gain control signal and the second gain control signal responsive to an output power level control signal, wherein the first gain control signal controls a gain of the first variable gain stage to vary the power level of the transmit signal at the intermediate frequency causing the output power level of the transmit signal to vary over a lower range of the predetermined range of output power levels, and wherein the second gain control signal controls a gain of the second variable gain stage to vary the power level of the transmit signal at the radio frequency causing the output power level of the transmit signal to vary over an upper range of the predetermined range of output power levels, wherein the gain controller further comprises:
a crossover circuit for providing continuous output power level control of the transmit signal between the lower range and the upper range of the predetermined range of the output power levels by controlling the first gain control signal and the second gain control signal responsive to the output power level control signal and a crossover threshold signal, wherein the crossover circuit further comprises:
a first clamp, coupled to receive the output power level control signal and the crossover threshold signal, for producing a first clamp output signal representative of the first gain control signal, wherein a level of the first clamp output signal is clamped to a level of the crossover threshold signal when a level of the output power control signal is greater than the level of the crossover threshold signal, and wherein the level of the first clamp output signal is equal to the level of the output power level control signal when the level of the output power control signal is less than the level of the crossover threshold signal; and a second clamp, coupled to receive the output power level control signal and the crossover threshold signal, for producing a second clamp output signal representative of the second gain control signal, wherein a level of the second clamp output signal is clamped to a level of the crossover threshold signal when a level of the output power control signal is less than the level of the crossover threshold signal, and wherein the level of the second clamp output signal is equal to the level of the output power level control signal when the level of the output power control signal is greater than the level of the crossover threshold signal.

2. A transmitter according to claim 1 wherein the signal generator further comprises:
a transmit intermediate frequency local oscillator for providing a transmit intermediate frequency local oscillator signal; and
a modulator for modulating the transmit intermediate frequency local oscillator signal with an information signal to produce the transmit signal at the intermediate frequency.

3. A transmitter according to claim 1 wherein the signal upconvertor further comprises:
a transmit radio frequency local oscillator for providing a transmit radio frequency local oscillator signal; and
a mixer for upconverting the transmit signal at the intermediate frequency to the transmit signal at the radio frequency responsive to the transmit radio frequency local oscillator signal.

4. A transmitter according to claim 1 wherein the gain controller further comprises:

a first linear transformer, coupled to receive the first clamp output signal from the first clamp, for converting the first clamp output signal to a first linear transformer output signal representative of the first gain control signal; and a second linear transformer, coupled to receive the second clamp output signal from the second clamp, for converting the second clamp output signal to a second linear transformer output signal representative of the second gain control signal.

5. A transmitter according to claim 4:
wherein the first linear transformer further comprises:
a first scaler, coupled to receive the first clamp output signal from the first clamp, for scaling the first clamp output signal by a first predetermined factor so that a sensitivity of gain of the first variable gain stage to the output power control signal equals one; and
a first shift circuit, coupled to the first scaler, for shifting the first clamp output signal by a second predetermined factor to produce a first offset between the first clamp output signal and the linear transformer output signal; and wherein the second linear transformer further comprises:
a second scaler, coupled to the second clamp, for scaling the second clamp output signal by a third predetermined factor so that a sensitivity of gain of the second variable gain stage to the output power control signal equals one; and
a second shift circuit, coupled to the second scaler, for shifting the second clamp output signal by a fourth predetermined factor to produce a second offset between the second clamp output signal and the linear transformer output signal.

6. A transmitter according to claim 4 wherein the gain controller further comprises:
a first predistortion circuit, coupled to the first linear transformer, for predistorting the first gain control signal responsive to the first linear transformer output signal to compensate for nonlinearities in a first transfer function representative of gain as a function of the first gain control signal for the first variable gain stage; and
a second predistortion circuit, coupled to the second linear transformer, for predistorting the second gain control signal responsive to the second linear transformer output signal to compensate for nonlinearities in a second transfer function representative of gain as a function of the second gain control signal for the second variable gain stage.

7. A transmitter for transmitting a transmit signal at a power level within a predetermined range of output power levels, the transmitter comprising:
a signal generator for generating the transmit signal, at an intermediate frequency;
a first variable gain stage, coupled to the signal generator, for controlling a power level of the transmit signal at the intermediate frequency responsive to a first gain control signal;
a signal upconvertor, coupled to the first variable gain stage, for converting the frequency of the transmit signal from the intermediate frequency to a radio frequency;
a second variable gain stage, coupled to the signal upconvertor, for controlling the power level of the transmit signal at the radio frequency responsive to a second gain control signal; and
a gain controller, coupled to the first variable gain stage and the second variable gain stage, for providing the first gain control signal and the second gain control signal responsive to an output power level control signal, wherein the first gain control signal controls a gain of the first variable gain stage to vary the power level of the transmit signal at the intermediate frequency causing the output power level of the transmit signal to vary over a lower range of the predetermined range of output power levels, and wherein the second gain control signal controls a gain of the second variable gain stage to vary the power level of the transmit signal at the radio frequency causing the output power level of the transmit signal to vary over an upper range of the predetermined range of output power levels;

wherein the gain controller further comprises:
   a crossover circuit for providing continuous output power level control of the transmit signal between the lower range and the upper range of the predetermined range of the output power levels by controlling the first gain control signal and the second gain control signal responsive to the output power level control signal and a crossover threshold signal, wherein the crossover circuit further comprises:
   a first clamp, coupled to receive the output power level control signal and the crossover threshold signal, for producing a first clamp output signal representative of the first gain control signal, wherein a level of the first clamp output signal is clamped to a level of the crossover threshold signal when a level of the output power control signal is greater than the level of the crossover threshold signal, and wherein the level of the first clamp output signal is equal to the level of the output power level control signal when the level of the output power control signal is less than the level of the crossover threshold signal; and a second clamp, coupled to receive the output power level control signal and the crossover threshold signal, for producing a second clamp output signal representative of the second gain control signal, wherein a level of the second clamp output signal is clamped to a level of the crossover threshold signal when a level of the output power control signal is less than the level of the crossover threshold signal, and wherein the level of the second clamp output signal is equal to the level of the output power level control signal when the level of the output power control signal is greater than the level of the crossover threshold signal, wherein the gain controller further comprises:
   a first linear transformer, coupled to receive the first clamp output signal from the first clamp, for converting the first clamp output signal to a first linear transformer output signal representative of the first gain control signal; and a second linear transformer, coupled to receive the second clamp output signal from the second clamp, for converting the second clamp output signal to a second linear transformer output signal representative of the second gain control signal, and wherein the gain controller further comprises:
   a first predistortion circuit, coupled to the first linear transformer, for predistorting the first gain control signal responsive to the first linear transformer output signal to compensate for nonlinearities in a first transfer function representative of gain as a function of the first gain control signal for the first variable gain stage; and a second predistortion circuit, coupled to the second linear transformer, for predistorting the second gain control signal responsive to the second linear transformer output signal to compensate for nonlinearities in a second transfer function representative of gain as a function of the second gain control signal for the second variable gain stage.

8. A transmitter according to claim 7 wherein the signal generator further comprises:
   a transmit intermediate frequency local oscillator for providing a transmit intermediate frequency local oscillator signal; and
   a modulator for modulating the transmit intermediate frequency local oscillator signal with an information signal to produce the transmit signal at the intermediate frequency.

9. A transmitter according to claim 7 wherein the signal upconvertor further comprises:
   a transmit radio frequency local oscillator for providing a transmit radio frequency local oscillator signal; and
   a mixer for upconverting the transmit signal at the intermediate frequency to the transmit signal at the radio frequency responsive to the transmit radio frequency local oscillator signal.

10. A transmitter according to claim 7:
wherein the first linear transformer further comprises:
   a first scaler, coupled to receive the first clamp output signal from the first clamp, for scaling the first clamp output signal by a first predetermined factor so that a sensitivity of gain of the first variable gain stage to the output power control signal equals one; and
   a first shift circuit, coupled to the first scaler, for shifting the first clamp output signal by a second predetermined factor to produce a first offset between the first clamp output signal and the linear transformer output signal; and wherein the second linear transformer further comprises:
   a second scaler, coupled to the second clamp, for scaling the second clamp output signal by a third predetermined factor so that a sensitivity of gain of the second variable gain stage to the output power control signal equals one; and
   a second shift circuit, coupled to the second scaler, for shifting the second clamp output signal by a fourth predetermined factor to produce a second offset between the second clamp output signal and the linear transformer output signal.

11. A transmitter for transmitting a transmit signal at a power level within a predetermined range of output power levels, the transmitter comprising:
   a signal generator for generating the transmit signal at an intermediate frequency, wherein the signal generator further comprises:
     a transmit intermediate frequency local oscillator for providing a transmit intermediate frequency local oscillator signal; and
     a modulator for modulating the transmit intermediate frequency local oscillator signal with an information signal to produce the transmit signal at the intermediate frequency;
   a first variable gain stage, coupled to the signal generator, for controlling a power level of the transmit signal at the intermediate frequency responsive to a first gain control signal;
   a signal upconvertor, coupled to the first variable gain stage, for converting the frequency of the transmit signal from the intermediate frequency to a radio frequency, wherein the signal upconvertor further comprises:
a transmit radio frequency local oscillator for providing a transmit radio frequency local oscillator signal;
a mixer for upconverting the transmit signal at the intermediate frequency to the transmit signal at the radio frequency responsive to the transmit radio frequency local oscillator signal; and
a second variable gain stage, coupled to the signal upconvertor, for controlling the power level of the transmit signal at the radio frequency responsive to a second gain control signal; and
a gain controller, coupled to the first variable gain stage and the second variable gain stage, for providing the first gain control signal and the second gain control signal responsive to an output power level control signal, wherein the first gain control signal controls a gain of the first variable gain stage to vary the power level of the transmit signal at the intermediate frequency causing the output power level of the transmit signal to vary over a lower range of the predetermined range of output power levels, and wherein the second gain control signal controls a gain of the second variable gain stage to vary the power level of the transmit signal at the radio frequency causing the output power level of the transmit signal to vary over an upper range of the predetermined range of output power levels,
wherein the gain controller further comprises:
a crossover circuit for providing continuous output power level control of the transmit signal between the lower range and the upper range of the predetermined range of the output power levels by controlling the first gain control signal and the second gain control signal responsive to the output power level control signal and a crossover threshold signal,
wherein the crossover circuit further comprises:
a first clamp, coupled to receive the output power level control signal and the crossover threshold signal, for producing a first clamp output signal representative of the first gain control signal, wherein a level of the first clamp output signal is clamped to a level of the crossover threshold signal when a level of the output power control signal is greater than the level of the crossover threshold signal, and wherein the level of the first clamp output signal is equal to the level of the output power level control signal when the level of the output power control signal is less than the level of the crossover threshold signal; and
a second clamp, coupled to receive the output power level control signal and the crossover threshold signal, for producing a second clamp output signal representative of the second gain control signal, wherein a level of the second clamp output signal is clamped to a level of the crossover threshold signal when a level of the output power control signal is less than the level of the crossover threshold signal, and wherein the level of the second clamp output signal is equal to the level of the output power level control signal when the level of the output power control signal is greater than the level of the crossover threshold signal.

12. A transmitter according to claim 11 wherein the gain controller further comprises:
a first linear transformer, coupled to receive the first clamp output signal from the first clamp, for converting the first clamp output signal to a first linear transformer output signal representative of the first gain control signal; and
a second linear transformer, coupled to receive the second clamp output signal from the second clamp, for converting the second clamp output signal to a second linear transformer output signal representative of the second gain control signal.

13. A transmitter according to claim 12:
wherein the first linear transformer further comprises:
a first scaler, coupled to receive the first clamp output signal from the first clamp, for scaling the first clamp output signal by a first predetermined factor so that a sensitivity of gain of the first variable gain stage to the output power control signal equals one; and
a first shift circuit, coupled to the first scaler, for shifting the first clamp output signal by a second predetermined factor to produce a first offset between the first clamp output signal and the linear transformer output signal; and
wherein the second linear transformer further comprises:
a second scaler, coupled to the second clamp, for scaling the second clamp output signal by a third predetermined factor so that a sensitivity of gain of the second variable gain stage to the output power control signal equals one; and
a second shift circuit, coupled to the second scaler, for shifting the second clamp output signal by a fourth predetermined factor to produce a second offset between the second clamp output signal and the linear transformer output signal.

14. A transmitter according to claim 12 wherein the gain controller further comprises:
a first predistortion circuit, coupled to the first linear transformer, for predistorting the first gain control signal responsive to the first linear transformer output signal to compensate for nonlinearities in a first transfer function representative of gain as a function of the first gain control signal for the first variable gain stage; and
a second predistortion circuit, coupled to the second linear transformer, for predistorting the second gain control signal responsive to the second linear transformer output signal to compensate for nonlinearities in a second transfer function representative of gain as a function of the second gain control signal for the second variable gain stage.

15. A code division multiple access (CDMA) radiotelephone comprising:
a receiver for receiving a closed loop correction signal and for generating a received signal strength indication (RSSI) signal; and
a transmitter for transmitting a transmit signal at a power level within a predetermined range of output power levels, the transmitter comprising:
a radiotelephone controller for providing a first gain control signal and a second gain control signal responsive to the output power level control signal, wherein the output power level control signal is a sum of a channel gain adjust signal, the received signal strength indication signal and the closed loop correction signal;
a signal generator for generating the transmit signal at an intermediate frequency;
a first variable gain stage, coupled to the signal generator, for controlling a power level of the transmit signal at the intermediate frequency responsive to a first gain control signal;

a signal upconvertor, coupled to the first variable gain stage, for converting the frequency of the transmit signal from the intermediate frequency to a radio frequency;

a second variable gain stage, coupled to the signal upconvertor, for controlling the power level of the transmit signal at the radio frequency responsive to a second gain control signal; and a gain controller, coupled to the first variable gain stage and the second variable gain stage, for providing the first gain control signal and the second gain control signal responsive to an output power level control signal, wherein the first gain control signal controls a gain of the first variable gain stage to vary the power level of the transmit signal at the intermediate frequency causing the output power level of the transmit signal to vary over a lower range of the predetermined range of output power levels, and wherein the second gain control signal controls a gain of the second variable gain stage to vary the power level of the transmit signal at the radio frequency causing the output power level of the transmit signal to vary over an upper range of the predetermined range of output power levels, wherein the gain controller further comprises:
a crossover circuit for providing continuous output power level control of the transmit signal between the lower range and the upper range of the predetermined range of the output power levels by controlling the first gain control signal and the second gain control signal responsive to the output power level control signal and a crossover threshold signal, wherein the crossover circuit further comprises:
a first clamp, coupled to receive the output power level control signal and the crossover threshold signal, for producing a first clamp output signal representative of the first gain control signal, wherein a level of the first clamp output signal is clamped to a level of the crossover threshold signal when a level of the output power control signal is greater than the level of the crossover threshold signal, and wherein the level of the first clamp output signal is equal to the level of the output power level control signal when the level of the output power control signal is less than the level of the crossover threshold signal; and a second clamp, coupled to receive the output power level control signal and the crossover threshold signal, for producing a second clamp output signal representative of the second gain control signal, wherein a level of the second clamp output signal is clamped to a level of the crossover threshold signal when a level of the output power control signal is less than the level of the crossover threshold signal, and wherein the level of the second clamp output signal is equal to the level of the output power level control signal when the level of the output power control signal is greater than the level of the crossover threshold signal.

16. A CDMA radiotelephone according to claim 15 wherein the signal generator further comprises:
a transmit intermediate frequency local oscillator for providing a transmit intermediate frequency local oscillator signal; and a modulator for modulating the transmit intermediate frequency local oscillator signal with an information signal to produce the transmit signal at the intermediate frequency.

17. A CDMA radiotelephone according to claim 15 wherein the signal upconvertor further comprises:
a transmit radio frequency local oscillator for providing a transmit radio frequency local oscillator signal; and a mixer for upconverting the transmit signal at the intermediate frequency to the transmit signal at the radio frequency responsive to the transmit radio frequency local oscillator signal.

18. A CDMA radiotelephone according to claim 15 wherein the gain controller further comprises:
a first linear transformer, coupled to receive the first clamp output signal from the first clamp, for converting the first clamp output signal to a first linear transformer output signal representative of the first gain control signal; and a second linear transformer, coupled to receive the second clamp output signal from the second clamp, for converting the second clamp output signal to a second linear transformer output signal representative of the second gain control signal.

19. A CDMA radiotelephone according to claim 18 wherein the first linear transformer further comprises:
a first scaler, coupled to receive the first clamp output signal from the first clamp, for scaling the first clamp output signal by a first predetermined factor so that a sensitivity of gain of the first variable gain stage to the output power control signal equals one; and a first shift circuit, coupled to the first scaler, for shifting the first clamp output signal by a second predetermined factor to produce a first offset between the first clamp output signal and the linear transformer output signal; and wherein the second linear transformer further comprises:
a second scaler, coupled to the second clamp, for scaling the second clamp output signal by a third predetermined factor so that a sensitivity of gain of the second variable gain stage to the output power control signal equals one; and a second shift circuit, coupled to the second scaler, for shifting the second clamp output signal by a fourth predetermined factor to produce a second offset between the second clamp output signal and the linear transformer output signal.

20. A CDMA radiotelephone according to claim 18 wherein the gain controller further comprises:
a first predistortion circuit, coupled to the first linear transformer, for predistorting the first gain control signal responsive to the first linear transformer output signal to compensate for nonlinearities in a first transfer function representative of gain as a function of the first gain control signal for the first variable gain stage; and a second predistortion circuit, coupled to the second linear transformer, for predistorting the second gain control signal responsive to the second linear transformer output signal to compensate for nonlinearities in a second transfer function representative of gain as a function of the second gain control signal for the second variable gain stage.

21. A method for controlling an output power level of a transmit signal within a predetermined range of output power levels, the method comprising the steps of:
varying a power level of the transmit signal at an intermediate frequency to produce the output power level for the transmit signal within a lower range of the predetermined range of output power levels;

varying a power level of the transmit signal at a radio frequency to produce the output power level for the transmit signal within an upper range of the predetermined range of output power levels;

determining the output power level for the transmit signal; and comparing the output power level to an output power crossover threshold level;

wherein the step of varying the power level of the transmit signal at an intermediate frequency is performed when the output power level is less than the output power crossover threshold level to produce the output power level for the transmit signal, and wherein the step of varying the power level of the transmit signal at a radio frequency is performed when the output power level is greater or equal to than the output power crossover threshold level to produce the output power level for the transmit signal.

22. A method according to claim 21:

wherein the power level of the transmit signal at the intermediate frequency is controlled with a first variable gain stage, wherein the power level of the transmit signal at the radio frequency is controlled with a second variable gain stage, and wherein the steps of varying the power level of the transmit signal at the intermediate frequency and at the radio frequency further comprises the steps of:

varying a gain of the first variable gain stage and holding a gain of the second variable gain stage over the lower range of the predetermined range of output power levels to produce the output power level for the transmit signal; and varying a gain of the second variable gain stage and holding a gain of the first variable gain stage over the upper range of the predetermined range of output power levels to produce the output power level for the transmit signal.

23. A method according to claim 22 further comprises the steps of:

adjusting a slope of a gain versus the output power level for the first variable gain stage of the first variable gain stage to a first predetermined value; and adjusting a slope of a gain versus the output power level for the second variable gain stage of the second variable gain stage to the first predetermined value.

24. A method according to claim 23 further comprises the steps of:

adjusting an offset of the gain versus the output power level for the first variable gain stage of the first variable gain stage to a second predetermined value; and adjusting an offset of the gain versus the output power level for the second variable gain stage of the second variable gain stage to a third predetermined value;

wherein the gain versus the output power level for the first variable gain stage combines with the gain versus the output power level for the second variable gain stage to produce a substantially linear total gain versus the output power level for the transmitter.

25. A method according to claim 22 further comprising the steps of:

removing nonlinearities in the gain versus the output power level for the first variable gain stage; and removing nonlinearities in the gain versus the output power level for the second variable gain stage.

26. A method for operating a code division multiple access (CDMA) radiotelephone comprising the steps of:

receiving a closed loop correction signal;

generating a received signal strength indication (RSSI) signal;

generating an output power control signal responsive to the closed loop correction signal, the RSSI signal and a channel gain adjust signal;

transmitting a transmit signal at an output power level within a predetermined range of output power levels responsive to the output power control signal, the step of transmitting further comprising the steps of:

varying a power level of the transmit signal at an intermediate frequency to produce the output power level for the transmit signal within a lower range of the predetermined range of output power levels;

varying a power level of the transmit signal at a radio frequency to produce the output power level for the transmit signal within an upper range of the predetermined range of output power levels;

determining the output power level for the transmit signal; and comparing the output power level to an output power crossover threshold level;

wherein the step of varying the power level of the transmit signal at an intermediate frequency is performed when the output power level is less than the output power crossover threshold level to produce the output power level for the transmit signal, and wherein the step of varying the power level of the transmit signal at a radio frequency is performed when the output power level is greater or equal to than the output power crossover threshold level to produce the output power level for the transmit signal.

27. A method according to claim 26:

wherein the power level of the transmit signal at the intermediate frequency is controlled with a first variable gain stage, wherein the power level of the transmit signal at the radio frequency is controlled with a second variable gain stage, and wherein the steps of varying the power level of the transmit signal at the intermediate frequency and at the radio frequency further comprises the steps of:

varying a gain of the first variable gain stage and holding a gain of the second variable gain stage over the lower range of the predetermined range of output power levels to produce the output power level for the transmit signal; and varying a gain of the second variable gain stage and holding a gain of the first variable gain stage over the upper range of the predetermined range of output power levels to produce the output power level for the transmit signal.

28. A method according to claim 27 further comprises the steps of:

adjusting a slope of a gain versus the output power level for the first variable gain stage of the first variable gain stage to a first predetermined value; and adjusting a slope of a gain versus the output power level for the second variable gain stage of the second variable gain stage to the first predetermined value.

29. A method according to claim 28 further comprises the steps of:

adjusting an offset of the gain versus the output power level for the first variable gain stage of the first variable gain stage to a second predetermined value; and adjusting an offset of the gain versus the output power level for the second variable gain stage of the second variable gain stage to a third predetermined value;

wherein the gain versus the output power level for the first variable gain stage combines with the gain versus the output power level for the second variable gain stage to produce a substantially linear total gain versus the output power level for the transmitter.

30. A method according to claim 27 further comprising the steps of:

removing nonlinearities in the gain versus the output power level for the first variable gain stage; and removing nonlinearities in the gain versus the output power level for the second variable gain stage.

* * * * *